(12) United States Patent
Liu et al.

(10) Patent No.: US 9,609,589 B2
(45) Date of Patent: Mar. 28, 2017

(54) APPARATUS AND METHOD FOR PROCESSING DOWNLINK SIGNAL

(71) Applicant: Huawei Technologies Co., Ltd., Shenzhen (CN)

(72) Inventors: Ziyan Liu, Nanjing (CN); Yongmei Zeng, Shanghai (CN); Xiaoming Duan, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 340 days.

(21) Appl. No.: 14/304,436

(22) Filed: Jun. 13, 2014

(65) Prior Publication Data

US 2014/0313959 A1    Oct. 23, 2014

Related U.S. Application Data

(63) Continuation of application No. PCT/CN2012/086564, filed on Dec. 13, 2012.

(30) Foreign Application Priority Data

Dec. 13, 2011    (CN) .......................... 2011 1 0415042

(51) Int. Cl.
*H04W 52/02* (2009.01)
*H04W 52/52* (2009.01)
*H04B 1/04* (2006.01)

(52) U.S. Cl.
CPC ...... *H04W 52/0206* (2013.01); *H04B 1/0483* (2013.01); *H04W 52/52* (2013.01); *H04B 2001/0408* (2013.01); *Y02B 60/50* (2013.01)

(58) Field of Classification Search
CPC .. H04W 52/52; H04W 52/0206; Y02B 60/50; H04B 2001/0408; H04B 1/0483
(Continued)

(56) References Cited

U.S. PATENT DOCUMENTS 5,499,395 A * 3/1996 Doi ....................... H04W 16/06
370/328
5,546,443 A    8/1996 Raith
(Continued)

FOREIGN PATENT DOCUMENTS

CN    1258972 A    7/2000
CN    1918814 A    2/2007
(Continued)

*Primary Examiner* — Paul H Masur
(74) *Attorney, Agent, or Firm* — Slater Matsil, LLP

(57) ABSTRACT

An apparatus includes a downlink signal differentiating unit is configured to receive a downlink signal and differentiate a type of the downlink signal. A public baseband processing unit is connected to the downlink signal differentiating unit and is configured to receive a public downlink signal obtained by the downlink signal differentiating unit by the differentiating, to encode and modulate the public downlink signal to obtain a public baseband signal, and to transmit the public baseband signal to a carrier unit. A traffic baseband processing unit is connected to the downlink signal differentiating unit, and is configured to receive a traffic downlink signal obtained by the downlink signal differentiating unit by the differentiating, to encode and modulate the traffic downlink signal to obtain a traffic baseband signal, and to transmit the traffic baseband signal to the carrier unit.

20 Claims, 10 Drawing Sheets

(58) Field of Classification Search
USPC ........................................ 330/52, 124 R, 126
See application file for complete search history.

(56) References Cited

U.S. PATENT DOCUMENTS

| | | | |
|---|---|---|---|
| 6,574,019 B1 | 6/2003 | Harada | |
| 7,019,710 B1* | 3/2006 | Shurvinton | H01Q 1/246 |
| | | | 342/375 |
| 2002/0075943 A1* | 6/2002 | Kurihara | H04B 1/707 |
| | | | 375/146 |
| 2005/0105632 A1* | 5/2005 | Catreux-Erces | H04B 7/0615 |
| | | | 375/267 |
| 2008/0290938 A1* | 11/2008 | Gupta | H03F 3/2178 |
| | | | 330/127 |

FOREIGN PATENT DOCUMENTS

| | | |
|---|---|---|
| CN | 201167390 Y | 12/2008 |
| CN | 201656980 U | 11/2010 |
| CN | 102438302 A | 5/2012 |
| EP | 0948144 A2 | 10/1999 |
| EP | 1217759 A2 | 6/2002 |
| JP | 11243579 A | 9/1999 |
| JP | 11285048 A | 10/1999 |
| JP | 2003283408 A | 10/2003 |

* cited by examiner

APPARATUS AND METHOD FOR PROCESSING DOWNLINK SIGNAL

This application is a continuation of International Application No. PCT/CN2012/086564, filed on Dec. 13, 2012, which claims priority to Chinese Patent Application No. 201110415042.8, filed on Dec. 13, 2011, both of which are hereby incorporated by reference in their entireties.

TECHNICAL FIELD

The present invention relates to the field of wireless communication and, in particular embodiments, to an apparatus and a method for processing a downlink signal.

BACKGROUND

With increasing decrease in energy resources and a continuously growing energy price, energy conservation becomes an important factor considered in the design of wireless communication. However, in a wireless communication system, energy is mainly consumed on a base station. Therefore, an energy conservation technology of the base station is especially important. A basic architecture of the base station is shown in FIG. 1, including a control module, a transmission module, an uplink, and a downlink. The uplink includes an uplink baseband processing module, an uplink carrier module, and an uplink power amplifier module. Similarly, the downlink includes a downlink baseband processing module, a downlink carrier module, and a downlink power amplifier module. In particular, in a distributed base station, the architecture of the base station further includes an interface module configured to implement signal transmission between the baseband processing modules and the carrier modules. To meet energy requirements under a high load, each module of the base station is designed according to a high load standard. As a result, a large number of energy resources are wasted unnecessarily in a low load state where there is a small quantity of traffic volume.

To reduce energy consumption under a medium or low load, a method in the prior art is as follows. Static bias voltage of a power amplifier module and power supply of a radio frequency module are turned off according to output power of the power amplifier module; voltage and frequency of the baseband processing module or a refresh rate of a register are adjusted dynamically according to the quantity of traffic volume. Specifically, for the power amplifier module and the radio frequency module, when the traffic volume of the base station is 0, the power amplifier module does not output power, and the bias voltage of the power amplifier module can be turned off to reduce static power consumption when the power amplifier module does not output power. If there is no traffic in a long period of time, the power supply of the radio frequency module is further turned off to reduce static power consumption of the radio frequency module. For the baseband processing module, the voltage and frequency of the baseband processing module or the refresh rate of the register are adjusted dynamically according to the quantity of traffic volume. For example, dynamic voltage and frequency scaling (DVFS) is used, and a dynamic adjustment policy is formulated in advance; when the traffic volume decreases, the frequency and voltage are reduced to reduce the power consumption of the baseband processing module.

During the implementation process of processing a downlink signal, the inventor discovers that the prior art has at least the following problems. In wireless communication systems such as a Global System for Mobile Communication (GSM) and a Universal Mobile Telecommunications System (UMTS), public signals such as a pilot signal, synchronization signal, and broadcast signal specified in a protocol need to be transmitted continuously. As a result, the power amplifier module outputs power continuously, and the power amplifier module and the radio frequency module cannot be turned off. All submodules in a base station processing module need different voltages or frequencies, and thus the unified adjustment policy must simultaneously meet energy requirements of all the sub modules. Therefore, the power consumption of the base station cannot be reduced effectively.

SUMMARY

One aspect of the present invention provides an apparatus and a method for processing a downlink signal, which can effectively reduce energy consumption of a base station.

To achieve the foregoing objective, one aspect of the present invention uses the following technical solutions:

An apparatus for processing a downlink signal is applied to a downlink of a base station and includes a downlink signal differentiating unit, a public baseband processing unit, and a traffic baseband processing unit. The downlink signal differentiating unit is connected to a transmission unit in the base station, and is configured to receive a downlink signal transmitted by the transmission unit and differentiate a type of the downlink signal, where the downlink signal is classified into a public downlink signal and a traffic downlink signal. The public baseband processing unit is connected to the downlink signal differentiating unit, and is configured to receive a public downlink signal obtained by the downlink signal differentiating unit by means of differentiation, encode and modulate the public downlink signal to obtain a public baseband signal, and transmit the public baseband signal to a carrier unit. The traffic baseband processing unit is connected to the downlink signal differentiating unit, and is configured to receive a traffic downlink signal obtained by the downlink signal differentiating unit by means of differentiation, encode and modulate the traffic downlink signal to obtain a traffic baseband signal, and transmit the traffic baseband signal to the carrier unit.

An apparatus for processing a downlink signal is applied to a downlink of a base station and includes a carrier signal differentiating unit, a public power amplifier unit, and a traffic power amplifier unit. The carrier signal differentiating unit is connected to a carrier unit of the downlink of the base station, and is configured to receive a carrier signal obtained by the carrier unit by means of processing, and differentiate a type of the carrier signal, where the carrier signal is classified into a public carrier signal and a traffic carrier signal. The public power amplifier unit is connected to the carrier signal differentiating unit, and is configured to receive a public carrier signal obtained by the carrier signal differentiating unit by means of differentiation, and output a public output signal after amplifying power of the public carrier signal. The traffic power amplifier unit is connected to the carrier signal differentiating unit, and is configured to receive a traffic carrier signal obtained by the carrier signal differentiating unit by means of differentiation, and output a traffic output signal after amplifying power of the traffic carrier signal.

An apparatus for processing a downlink signal is applied to a downlink of a base station and includes a baseband signal differentiating unit, a public carrier module, a traffic carrier module, a public power amplifier unit, and a traffic power amplifier unit. The baseband signal differentiating unit is connected to the baseband processing unit of the downlink of the base station, and is configured to receive a baseband signal transmitted by the baseband processing unit, and differentiate a type of the received baseband signal, where the baseband signal is classified into a public baseband signal and a traffic baseband signal. The public carrier module is connected to the baseband signal differentiating unit, and is further configured to receive a public baseband signal obtained by the baseband signal differentiating unit by means of differentiation, perform up-conversion and digital-to-analog DA conversion on the public baseband signal to obtain a public carrier signal, and transmit the public carrier signal to the public power amplifier unit. The traffic carrier module is connected to the baseband signal differentiating unit, and is further configured to receive a traffic baseband signal obtained by the baseband signal differentiating unit by means of differentiation, perform up-conversion and digital-to-analog DA conversion on the traffic baseband signal to obtain a traffic carrier signal, and transmit the traffic carrier signal to the traffic power amplifier unit. The public power amplifier unit is connected to the public carrier module, and is configured to receive the public carrier signal transmitted by the public carrier module, and output a public output signal after amplifying power of the public carrier signal. The traffic power amplifier unit is connected to the traffic carrier module, and is configured to receive the traffic carrier signal transmitted by the traffic carrier module, and output a traffic output signal after amplifying power of the traffic carrier signal.

A base station includes a transmission unit, a control unit, an uplink device; and a downlink device including an apparatus for processing a downlink signal. The transmission unit is connected to the uplink device and the downlink device, and is configured to receive an uplink signal transmitted by the uplink device and is further configured to transmit a downlink signal to the downlink device. The control unit is connected to the downlink device, and is configured to control enabling and disabling of some function units and modules in the downlink device.

A method for processing a downlink signal is applied to an apparatus for processing a downlink signal. The apparatus for processing a downlink signal includes a transmission unit, a downlink signal differentiating unit, a public baseband processing unit, and a traffic baseband processing unit. The downlink signal differentiating unit is connected to the transmission unit, the public baseband processing unit is connected to the downlink signal differentiating unit, and the traffic baseband processing unit is connected to the downlink signal differentiating unit. The method for processing a downlink signal includes receiving, by the downlink signal differentiating unit, a downlink signal transmitted by the transmission unit in a base station, and differentiating a type of the downlink signal, where the downlink signal is classified into a public downlink signal and a traffic downlink signal; receiving, by the public baseband processing unit, a public downlink signal obtained by the downlink signal differentiating unit by means of differentiation, encoding and modulating the public downlink signal to obtain a public baseband signal, and transmitting the public baseband signal to a carrier unit; and receiving, by the traffic baseband processing unit, a traffic downlink signal obtained by the downlink signal differentiating unit by means of differentiation, encoding and modulating the traffic downlink signal to obtain a traffic baseband signal, and transmitting the traffic baseband signal to the carrier unit.

The apparatus and method for processing a downlink signal provided by the embodiments of the present invention, by separating a transmission link of a traffic signal from a transmission link of a public signal, enables a current energy conservation technology to disconnect or hibernate the transmission link of the traffic signal when there is no traffic signal. Compared with an architecture in the prior art where the transmission link of the traffic signal cannot be disconnected or hibernated due to long-term use of the transmission link by the public signal, the embodiments of the present invention can reduce energy consumption of a base station more effectively.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DETAILED DESCRIPTION OF ILLUSTRATIVE EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Embodiment 1

Figure 2:
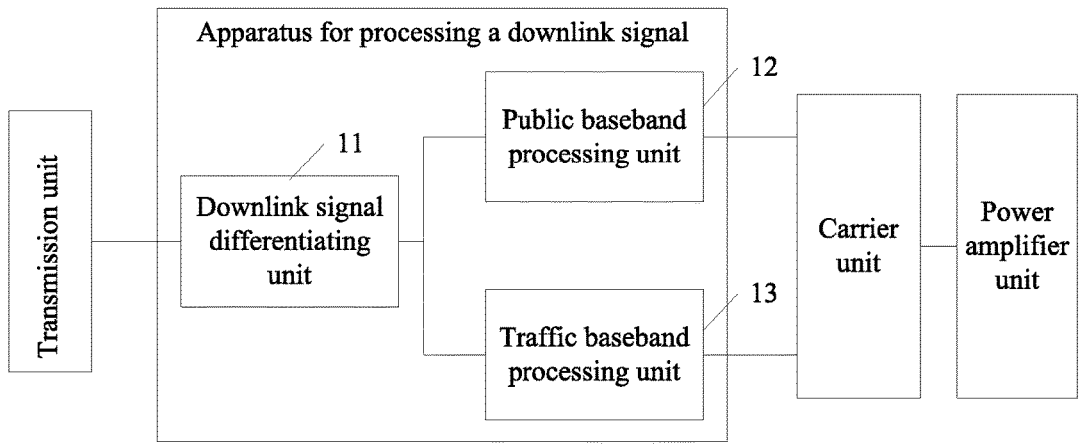
FIG. 2 is a schematic diagram illustrating components of an apparatus for processing a downlink signal according to Embodiment 1 of the present invention.

To save baseband processing resources, a traffic downlink signal and a public downlink signal are processed separately. This embodiment of the present invention provides an apparatus for processing a downlink signal. As shown in FIG. 2, the apparatus for processing a downlink signal can be applied to a downlink of a base station and includes a downlink signal differentiating unit 11, a public baseband processing unit 12, and a traffic baseband processing unit 13.

The downlink signal differentiating unit 11 is connected to a transmission unit in the base station, and is configured to receive a downlink signal transmitted by the transmission unit and differentiate a type of the downlink signal, where the downlink signal may be classified into a public downlink signal and a traffic downlink signal.

The transmission unit is an inherent function unit in the architecture of the base station, and can transmit both the traffic downlink signal and the public downlink signal to the downlink. In the prior art, a baseband processing unit receives and performs baseband processing operations such as encoding and modulation on the downlink signal transmitted by the transmission unit, no matter whether the downlink signal is a public downlink signal or a traffic downlink signal. In this embodiment, the original baseband processing unit may be replaced with the downlink signal differentiating unit 11, the public baseband processing unit 12, and the traffic baseband processing unit 13, so that the public downlink signal and the traffic downlink signal are processed separately. The transmission unit is connected to the downlink signal differentiating unit 11, and transmits both the traffic downlink signal and the public downlink signal to the downlink signal differentiating unit 11. The public downlink signal may be system information, broadcast and control signals, for example, public signals such as a broadcast control channel (BCCH) signal or pilot signal, or the like. The traffic downlink signal may be a signal for processing a user traffic, for example, a signal serving traffics such as user data downloading or user communication.

Specifically, the downlink signal differentiating unit 11 can differentiate the type of the downlink signal by using information such as a signal identifier, signal form, and signal strength of the downlink signal. The specific differentiation manner is not limited in this embodiment of the present invention. If the downlink signal differentiating unit 11 determines that the current downlink signal is a public downlink signal, the downlink signal differentiating unit 11 transmits the current downlink signal to the public baseband processing unit 12 for further processing; if the downlink signal differentiating unit 11 determines that the current downlink signal is a traffic downlink signal, the downlink signal differentiating unit 11 transmits the current downlink signal to the traffic baseband processing unit 13 for further processing.

It should be noted that the downlink signal differentiating unit 11 may be a function unit added to the architecture of the base station independently, and may also be a subunit embedded into the transmission unit, the public baseband processing unit 12 or the traffic baseband processing unit 13. For example, the downlink signal differentiating unit is a subunit embedded into the public baseband processing unit and can connect the public baseband processing unit 12 to the traffic baseband processing unit 13. When the public baseband processing unit receives a downlink signal, the downlink signal differentiating subunit determines whether the current signal is a public downlink signal; if the current signal is a public downlink signal, the current signal is transmitted to other subunits inside the public baseband processing unit 12 for processing; if the current signal is a traffic downlink signal, the current signal is transmitted to the traffic baseband processing unit 13 for processing.

The public baseband processing unit 12 is connected to the downlink signal differentiating unit 11, and is configured to receive a public downlink signal obtained by the downlink signal differentiating unit 11 by means of differentiation, encode and modulate the public downlink signal to obtain a public baseband signal, and transmit the public baseband signal to a carrier unit.

In this embodiment, after receiving the public downlink signal transmitted by the downlink signal differentiating unit 11, the public baseband processing unit 12 performs a series of baseband processing operations such as encoding and modulation on the public downlink signal. The specific baseband processing operations may be the same as the baseband processing operations used by the baseband processing unit in the prior art, which are not further described herein by this embodiment of the present invention.

The traffic baseband processing unit 13 is connected to the downlink signal differentiating unit 11, and is configured to receive a traffic downlink signal obtained by the downlink signal differentiating unit 11 by means of differentiation, encode and modulate the traffic downlink signal to obtain a traffic baseband signal, and transmit the traffic baseband signal to the carrier unit.

In this embodiment, after receiving the traffic downlink signal transmitted by the downlink signal differentiating unit 11, the traffic baseband processing unit 13 performs a series of baseband processing operations such as encoding and modulation on the traffic downlink signal. The specific baseband processing operations may be the same as the baseband processing operations used by the baseband processing unit in the prior art, which are not further described herein by this embodiment of the present invention.

Figure 1:
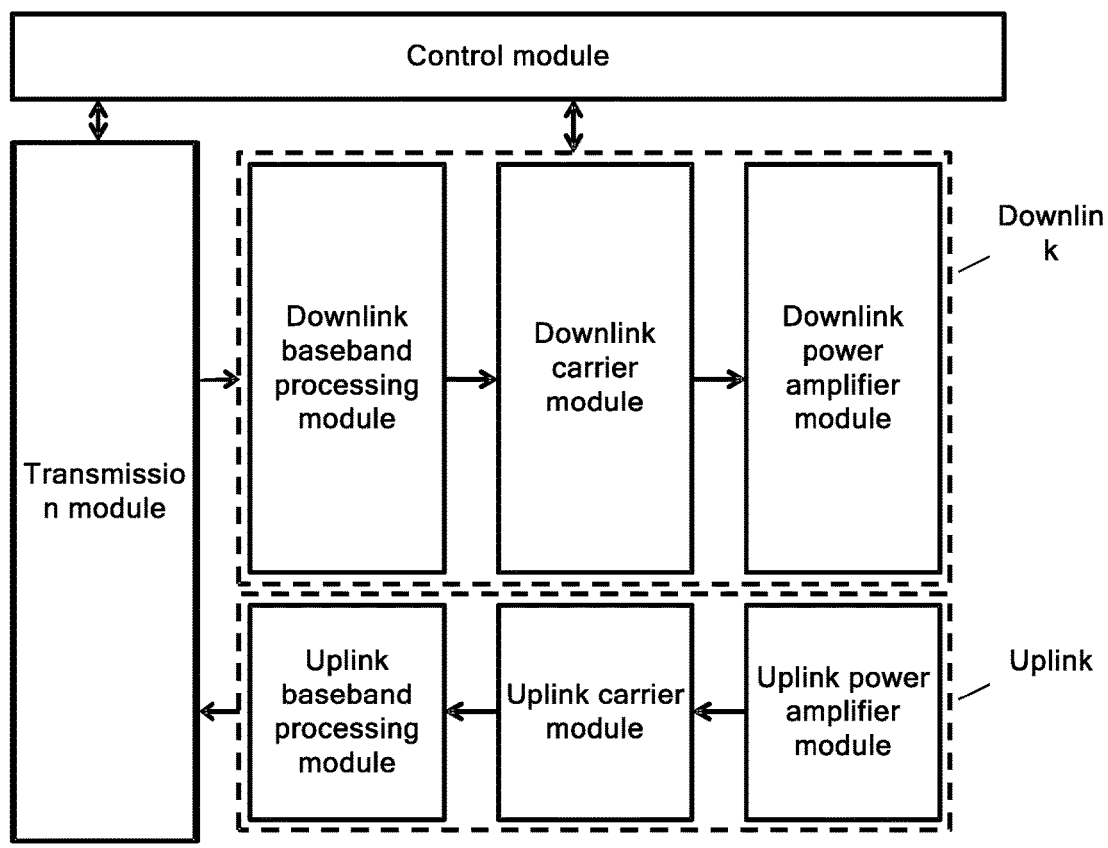
FIG. 1 is a schematic diagram of a basic architecture of a base station in the background technology.

Specifically, the method for separately processing the traffic downlink signal from the public downlink signal may be as follows: In the downlink of the base station illustrated in FIG. 1, a relatively simple small-scale baseband processing chip is added as the public baseband processing unit 12, while the original baseband processing module in the base station is used as the traffic baseband processing unit 13. In this way, the traffic signal and the public signal can be separately processed at a limited cost, and the public signal does not occupy the traffic baseband processing unit; and energy conservation and hibernation can be performed on the traffic baseband processing unit according to the quantity of traffic volume. In addition, a proper resource scheduling algorithm may be used to schedule the downlink traffic signal in a centralized manner in time dimension, so that a hibernation probability of the traffic baseband processing unit is increased, thereby reducing energy consumption of the baseband processing part more effectively.

Furthermore, in a distributed base station, an interface unit is further included; signal transmission between the baseband processing unit and the carrier unit is implemented by using the interface unit. In this embodiment of the present invention, the original interface unit may be reserved without a corresponding modification.

This embodiment of the present invention also provides a method for processing a downlink signal which is applied to the apparatus for processing a downlink signal, where the apparatus for processing a downlink signal includes a transmission unit, a downlink signal differentiating unit, a public baseband processing unit, and a traffic baseband processing unit, where the downlink signal differentiating unit is connected to the transmission unit, the public baseband processing unit is connected to the downlink signal differentiating unit, and the traffic baseband processing unit is connected to the downlink signal differentiating unit.

Figure 3:
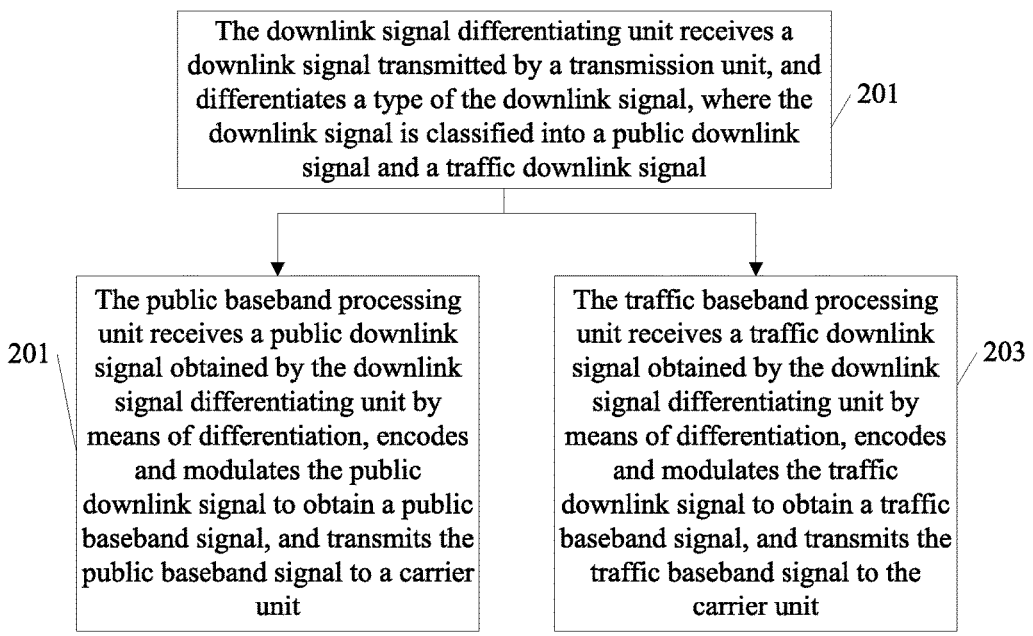
FIG. 3 is a flowchart of a method for processing a downlink signal according to Embodiment 1 of the present invention.

As shown in FIG. 3, the method for processing a downlink signal provided by this embodiment of the present invention may include the following.

201. The downlink signal differentiating unit receives a downlink signal transmitted by the transmission unit, and differentiates a type of the downlink signal, where the downlink signal is classified into a public downlink signal and a traffic downlink signal.

202. The public baseband processing unit receives a public downlink signal obtained by the downlink signal differentiating unit by means of differentiation, encodes and modulates the public downlink signal to obtain a public baseband signal, and transmits the public baseband signal to a carrier unit.

203. The traffic baseband processing unit receives a traffic downlink signal obtained by the downlink signal differentiating unit by means of differentiation, encodes and modulates the traffic downlink signal to obtain a traffic baseband signal, and transmits the traffic baseband signal to the carrier unit.

Because the apparatus for processing a downlink signal provided by this embodiment of the present invention can be applied to the base station and used as a part of the downlink device, to make a person skilled in the art understand a scenario where this embodiment of the present invention is applied to the base station, the following describes a scenario where the apparatus for processing a downlink signal is applied to the base station.

Figure 4:
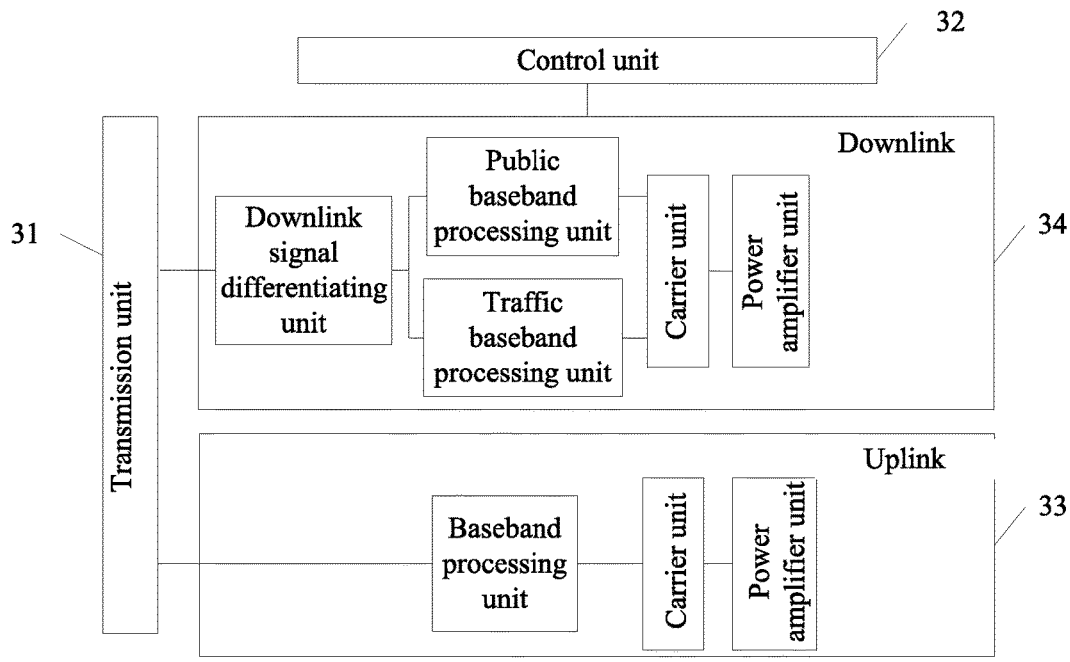
FIG. 4 is a schematic diagram illustrating components of a base station according to Embodiment 1 of the present invention.

This embodiment of the present invention also provides a base station. As shown in FIG. 4, the base station may include a transmission unit 31, a control unit 32, an uplink device 33, and a downlink device 34 that includes the apparatus for processing a downlink signal in this embodiment of the present invention.

The transmission unit 31, the control unit 32, the uplink device 33, and the downlink device 34 are inherent components of the base station. In an application scenario of this embodiment of the present invention, only a partial modification is made to the downlink device 34. However, the public baseband processing unit, the traffic baseband processing unit, the carrier unit, and the power amplifier unit provided in this embodiment of the present invention are internal function modules of the apparatus for processing a downlink signal and form the apparatus for processing a downlink signal. The apparatus for processing a downlink signal is an internal apparatus of the downlink device 34.

The transmission unit 31 is connected to the uplink device 33 and the downlink device 34, and is configured to receive an uplink signal transmitted by the uplink device 33 and is further configured to transmit a downlink signal to the downlink device 34.

The control unit 32 is connected to the downlink device 34, and is configured to control enabling and disabling of some function units and modules in the downlink device 34.

The transmission unit 31 may be configured to receive an uplink signal transmitted by the uplink device 33, and may be further configured to transmit a downlink signal to the downlink device 34. The control unit 32 is configured to schedule or control voltage, power, enabling or hibernation of each function unit in the downlink device 34.

Specifically, the control unit 32 may disable the traffic baseband processing unit in the downlink device 34 when there is no downlink traffic or there is low downlink traffic volume, and may also re-enable the traffic baseband processing unit in the downlink device 34 when the transmission unit 31 transmits a downlink signal to the downlink device 34. For example, the control unit 32 may shut down power supply of the traffic baseband processing unit when there is no downlink traffic, and may also reduce voltage and power of the traffic baseband processing unit when there is low traffic volume.

It should be noted that for details about specific descriptions of all steps in the method for processing a downlink signal provided by this embodiment of the present invention and specific descriptions of all function modules in the base station embodiment, reference may be made to the corresponding content in the apparatus for processing a downlink signal, which are not further described herein by this embodiment of the present invention.

The apparatus and method for processing a downlink signal provided by this embodiment of the present invention, by separating a transmission link of a traffic signal from a transmission link of a public signal, enables a current energy conservation technology to disconnect or hibernate the transmission link of the traffic signal when there is no traffic signal. Compared with an architecture in the prior art where the transmission link of the traffic signal cannot be disconnected or hibernated due to long-term use of the transmission link by the public signal, this embodiment of the present invention can reduce energy consumption of a base station more effectively.

Embodiment 2

Figure 5:
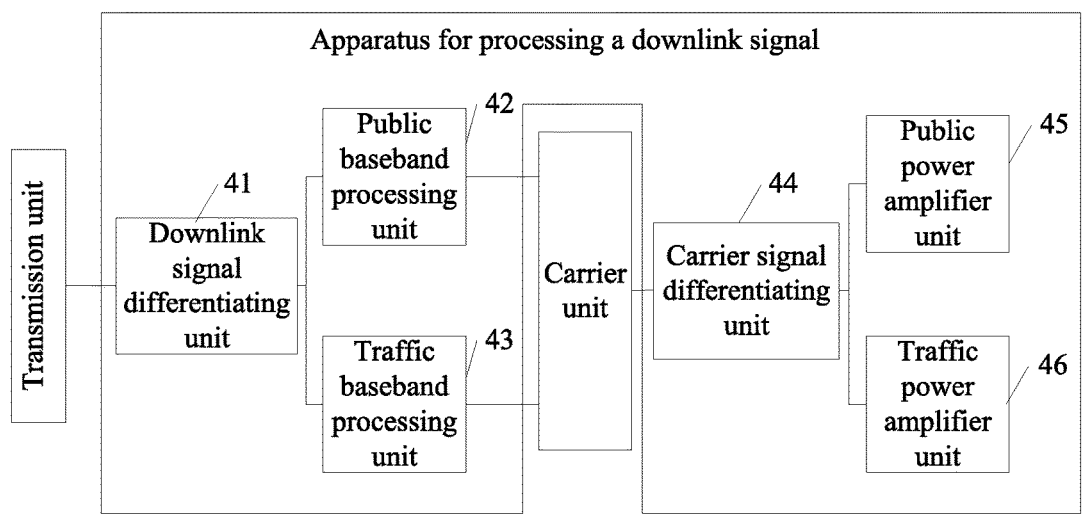
FIG. 5 is a schematic diagram illustrating components of an apparatus for processing a downlink signal according to Embodiment 2 of the present invention.

To save baseband processing resources and power amplification resources, this embodiment of the present invention provides an apparatus for processing a downlink signal. As shown in FIG. 5, the apparatus for processing a downlink signal can be applied to a downlink of a base station and includes a downlink signal differentiating unit 41, a public baseband processing unit 42, and a traffic baseband processing unit 43.

The downlink signal differentiating unit 41 is connected to a transmission unit, and is configured to receive a downlink signal transmitted by the transmission unit and differentiate a type of the downlink signal, where the downlink signal may be classified into a public downlink signal and a traffic downlink signal.

The public baseband processing unit 42 is connected to the downlink signal differentiating unit 41, and is configured to receive a public downlink signal obtained by the downlink signal differentiating unit 41 by means of differentiation, encode and modulate the public downlink signal to obtain a public baseband signal, and transmit the public baseband signal to a carrier unit.

The traffic baseband processing unit 43 is connected to the downlink signal differentiating unit 41, and is configured to receive a traffic downlink signal obtained by the downlink signal differentiating unit 41 by means of differentiation, encode and modulate the traffic downlink signal to obtain a traffic baseband signal, and transmit the traffic baseband signal to the carrier unit.

In an implementation scenario provided by this embodiment of the present invention, to further reduce energy consumption of a power amplifier unit, a power amplifier processing unit of a public carrier signal is separate from a power amplifier processing unit of a traffic carrier signal, so that a traffic power amplifier unit is disabled in a case where there is no traffic signal or there is low traffic volume. The apparatus for processing a downlink signal may further include a carrier signal differentiating unit 44, a public power amplifier unit 45, and a traffic power amplifier unit 46.

The carrier signal differentiating unit 44 is connected to the carrier unit, and is configured to receive a carrier signal obtained by the carrier unit by means of processing, and differentiate a type of the carrier signal, where the carrier signal is classified into a public carrier signal and a traffic carrier signal.

It may be understood that the traffic downlink signal may be traffic signals such as user data downloading and the public downlink signal may be public signals such as a broadcast control channel (Broadcast Control Channel, BCCH) signal or pilot signal. A traffic carrier signal is obtained after the traffic downlink signal undergoes baseband processing, and a public carrier signal is obtained after the public downlink signal undergoes baseband processing. Therefore, the type of the carrier signal can be classified into a traffic carrier signal and a public carrier signal. In a wireless communication system where public signal power occupies a large proportion, the traffic carrier signal cannot be separated, or the carrier module is cost-sensitive, corresponding energy processing may not be performed on the carrier module, same as Embodiment 1, and carrier processing is performed on the public baseband signal and the traffic baseband signal by using the original carrier module.

In this embodiment, the power amplifier processing module may be separated into the traffic power amplifier unit 46 and the public power amplifier unit 45, so that the traffic carrier signal and the public carrier signal are separated for power amplification processing. In addition, the carrier signal differentiating unit 44 may be added; the carrier signal differentiating unit 44 is connected to the original carrier module in the base station, and is configured to receive a carrier signal transmitted by the carrier module, differentiate a type of the carrier signal, and transmit a traffic carrier signal to the traffic power amplifier unit 46 for power amplification processing and transmit a public carrier signal to the public power amplifier unit 45 for power amplification processing.

It should be noted that the carrier signal differentiating unit 44 may be a function unit added to the architecture of the base station independently, and may also be a subunit embedded into the carrier unit, the public power amplifier unit 45 or the traffic power amplifier unit 46.

The public power amplifier unit 45 is connected to the carrier signal differentiating unit 44, and is configured to receive a public carrier signal obtained by the carrier signal differentiating unit 44 by means of differentiation, and output a public output signal after amplifying power of the public carrier signal.

In this embodiment, after receiving the public carrier signal transmitted by the carrier signal differentiating unit 44, the public power amplifier unit 45 performs a series of power amplification processing operations such as amplifying power of the public carrier signal. The specific power amplification processing operations may be the same as the power amplification processing operations used by the power amplifier module in the prior art, which are not further described herein by this embodiment of the present invention.

The traffic power amplifier unit 46 is connected to the carrier signal differentiating unit 44, and is configured to receive a traffic carrier signal obtained by the carrier signal differentiating unit 44 by means of differentiation, and output a traffic output signal after amplifying power of the traffic carrier signal.

In this embodiment, after receiving the traffic carrier signal transmitted by the carrier signal differentiating unit 44, the traffic power amplifier unit 46 performs a series of power amplification processing operations such as amplifying power of the traffic carrier signal. The specific power amplification processing operations may be the same as the power amplification processing operations used by the power amplifier processing module in the prior art, which are not further described herein by this embodiment of the present invention.

Specifically, the method for separating the traffic carrier signal from the public carrier signal may be as follows: In the downlink of the base station illustrated in FIG. 2, a relatively simple small-scale power amplifier processing chip is added as the public power amplifier unit 45, while the original power amplifier processing module in the base station is used as the traffic power amplifier processing unit 46. In this way, the traffic carrier signal and the public carrier signal are separately processing at a low cost; the public signal does not occupy the traffic power amplifier unit; disabling and energy conservation can be performed on the traffic power amplifier unit when there is no traffic signal or there is low service volume. In addition, a proper resource scheduling algorithm may be used to schedule the traffic signal in a centralized manner in time dimension, so that a hibernation probability of the traffic power amplifier unit is increased, thereby reducing energy consumption of the power amplifier part more effectively.

It should be noted that in a distributed base station, an interface unit is further included; signal transmission between the baseband processing unit and the carrier unit may be implemented by using the interface unit. In this embodiment of the present invention, the original interface unit may be reserved without a corresponding modification. For details about specific descriptions of some function units in the apparatus for processing a downlink signal provided by this embodiment of the present invention, reference may be made to the corresponding content in Embodiment 1, which are not further described herein by this embodiment of the present invention.

This embodiment of the present invention also provides a method for processing a downlink signal which can be applied to the apparatus for processing a downlink signal, where the apparatus for processing a downlink signal includes a transmission unit, a downlink signal differentiating unit, a public baseband processing unit, and a traffic baseband processing unit, where the downlink signal differentiating unit is connected to the transmission unit, the public baseband processing unit is connected to the downlink signal differentiating unit, and the traffic baseband processing unit is connected to the downlink signal differentiating unit.

Figure 6:
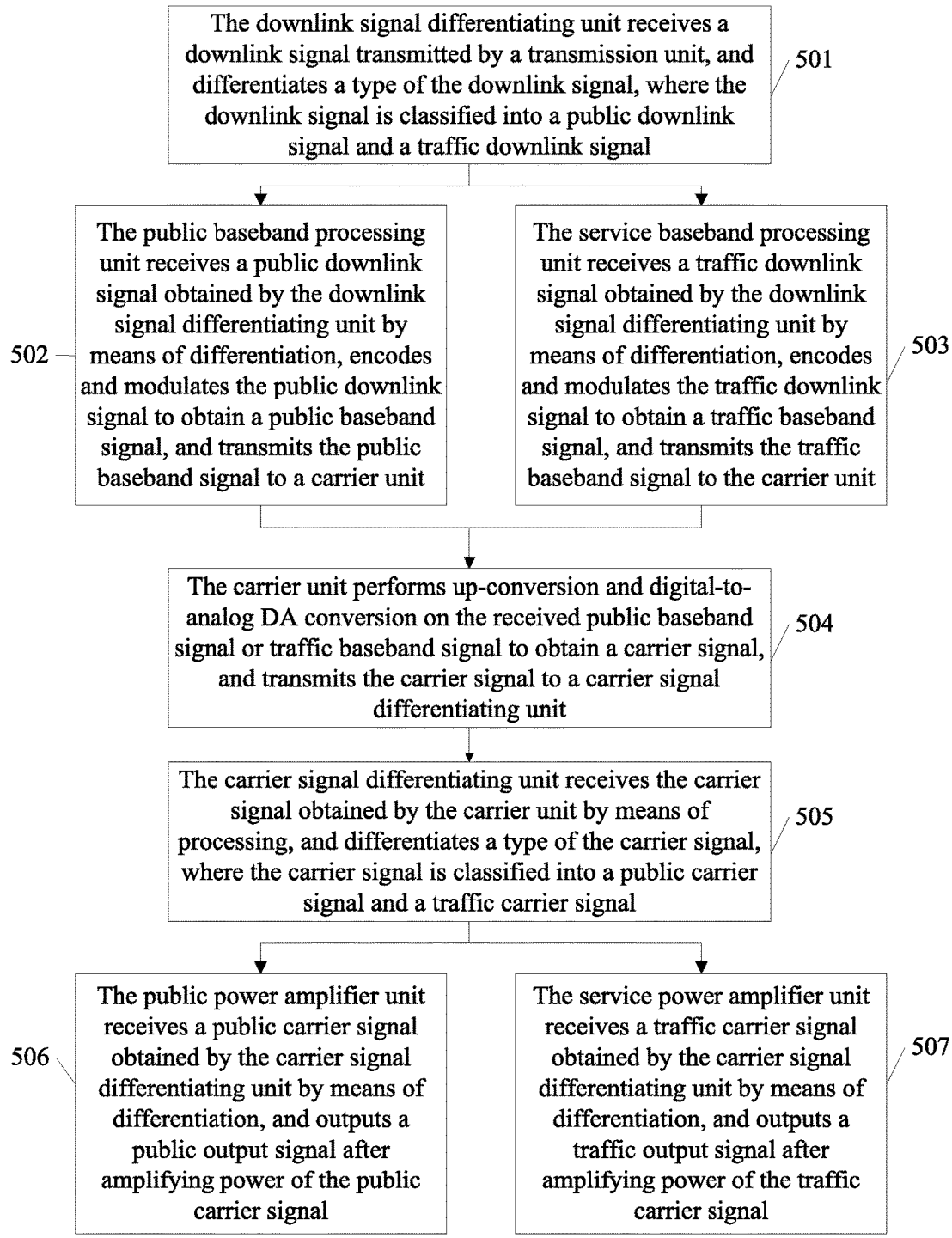
FIG. 6 is a flowchart of a method for processing a downlink signal according to Embodiment 2 of the present invention.

As shown in FIG. 6, the method may include the following.

501. The downlink signal differentiating unit receives a downlink signal transmitted by the transmission unit, and differentiates a type of the downlink signal, where the downlink signal is classified into a public downlink signal and a traffic downlink signal.

502. The public baseband processing unit receives a public downlink signal obtained by the downlink signal differentiating unit by means of differentiation, encodes and modulates the public downlink signal to obtain a public baseband signal, and transmits the public baseband signal to a carrier unit.

503. The traffic baseband processing unit receives a traffic downlink signal obtained by the downlink signal differentiating unit by means of differentiation, encodes and modulates the traffic downlink signal to obtain a traffic baseband signal, and transmits the traffic baseband signal to the carrier unit.

In an implementation scenario provided by this embodiment of the present invention, the apparatus for processing a downlink signal may further include a carrier signal differentiating unit, a public power amplifier unit, and a traffic power amplifier unit, where the carrier signal differentiating unit is connected to the carrier unit, the public power amplifier unit is connected to the carrier signal differentiating unit, and the traffic power amplifier unit is connected to the carrier signal differentiating unit. The method further includes:

504. The carrier unit performs up-conversion and digital-to-analog DA conversion on the received public baseband signal or traffic baseband signal to obtain a carrier signal, and transmits the carrier signal to the carrier signal differentiating unit.

In this embodiment, a corresponding separation or adjustment is not performed on the carrier unit; after receiving the public baseband signal and the traffic baseband signal transmitted by the public baseband processing unit and the traffic baseband processing unit, the carrier unit performs corresponding carrier processing on the two baseband signals, and then transmits obtained carrier signals to the carrier signal differentiating unit.

505. The carrier signal differentiating unit receives the carrier signal obtained by the carrier unit by means of processing, and differentiates a type of the carrier signal, where the carrier signal is classified into a public carrier signal and a traffic carrier signal.

506. The public power amplifier unit receives a public carrier signal obtained by the carrier signal differentiating unit by means of differentiation, and outputs a public output signal after amplifying power of the public carrier signal.

507. The traffic power amplifier unit receives a traffic carrier signal obtained by the carrier signal differentiating unit by means of differentiation, and outputs a traffic output signal after amplifying power of the traffic carrier signal.

Because the apparatus for processing a downlink signal provided by this embodiment of the present invention can be applied to the base station and used as a part of the downlink device, to make a person skilled in the art understand a scenario where this embodiment of the present invention is applied to the base station, the following describes a scenario where the apparatus for processing a downlink signal is applied to the base station.

Figure 7:
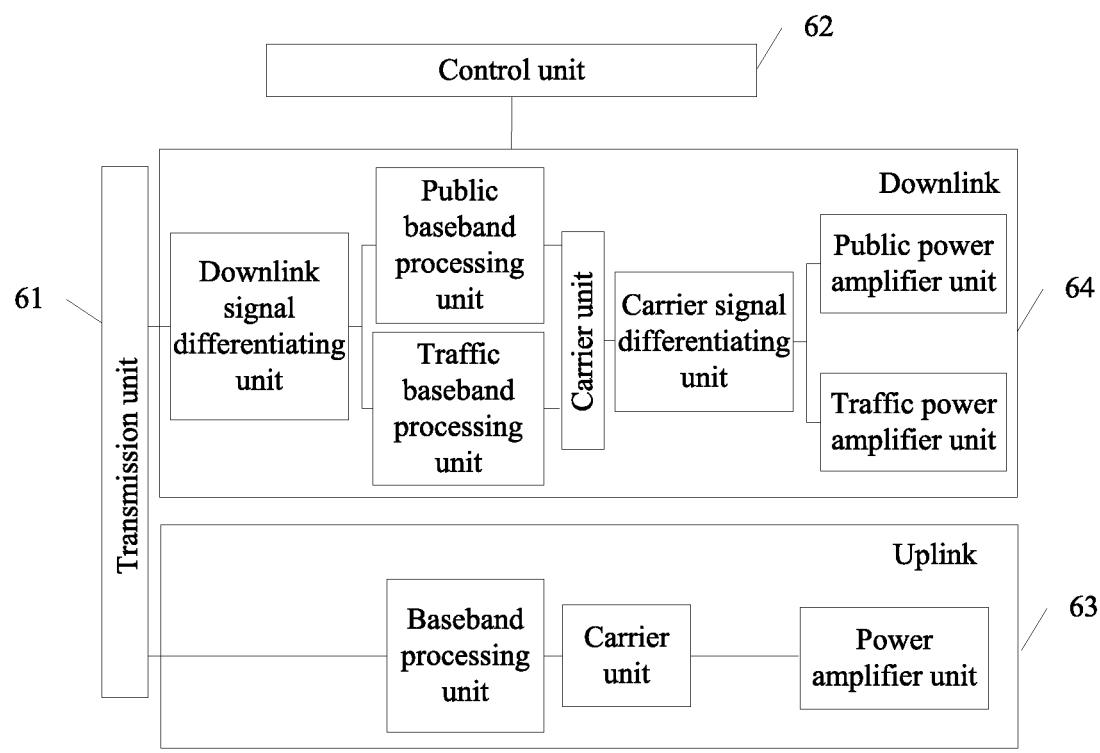
FIG. 7 is a schematic diagram illustrating components of a base station according to Embodiment 2 of the present invention.

This embodiment of the present invention also provides a base station. As shown in FIG. 7, the base station may include a transmission unit 61, a control unit 62, an uplink device 63, and a downlink device 64 that includes the apparatus for processing a downlink signal in this embodiment of the present invention.

The transmission unit 61, the control unit 62, the uplink device 63, and the downlink device 64 are inherent components of the base station. In an application scenario of this embodiment of the present invention, only a partial modification is made to the downlink device 64. However, the public baseband processing unit, the traffic baseband processing unit, the carrier unit, the traffic power amplifier unit, the public power amplifier unit, and the like, provided in this embodiment of the present invention are internal function modules of the apparatus for processing a downlink signal and form the apparatus for processing a downlink signal. The apparatus for processing a downlink signal is an internal apparatus of the downlink device 64.

The transmission unit 61 is connected to the uplink device 63 and the downlink device 64, and may be configured to receive an uplink signal transmitted by the uplink device 63 and may be further configured to transmit a downlink signal to the downlink device 64.

The control unit 62 is connected to the downlink device 64, and is configured to control enabling and disabling of some function units and modules in the downlink device 64.

Function units and modules controlled by the control unit 62 may include a traffic baseband processing unit and a traffic power amplifier unit. The control unit 62 monitors the transmission unit 61, disables the traffic baseband processing unit when the transmission unit 61 does not transmit a traffic downlink signal to the downlink device 64, and enables the traffic baseband processing unit when the transmission unit 61 transmits a traffic downlink signal to the downlink device 64.

Specifically, the control unit 62 may disable the traffic baseband processing unit when there is no downlink traffic or there is low downlink traffic volume, and may also re-enable the traffic baseband processing unit when the transmission unit 61 transmits a downlink signal to the downlink device 64. For example, the control unit 62 may shut down power supplies of the traffic baseband processing unit and the traffic power amplifier unit when there is no downlink traffic, and may also reduce voltage and power of the traffic baseband processing unit and the traffic power amplifier unit when there is low traffic volume.

It should be noted that for details about specific descriptions of the part of the method and the base station for processing a downlink signal in this embodiment of the present invention, reference may be made to Embodiment 1 and the corresponding content in the apparatus for processing a downlink signal in this embodiment of the present invention, which are not further described herein by this embodiment of the present invention.

The apparatus and method for processing a downlink signal provided by this embodiment of the present invention, by separating a transmission link of a traffic signal from a transmission link of a public signal, enables a current energy conservation technology to disconnect or hibernate the transmission link of the traffic signal when there is no traffic signal. Compared with an architecture in the prior art where the transmission link of the traffic signal cannot be disconnected or hibernated due to long-term use of the transmission link by the public signal, this embodiment of the present invention can reduce energy consumption of a base station more effectively.

Embodiment 3

Figure 8:
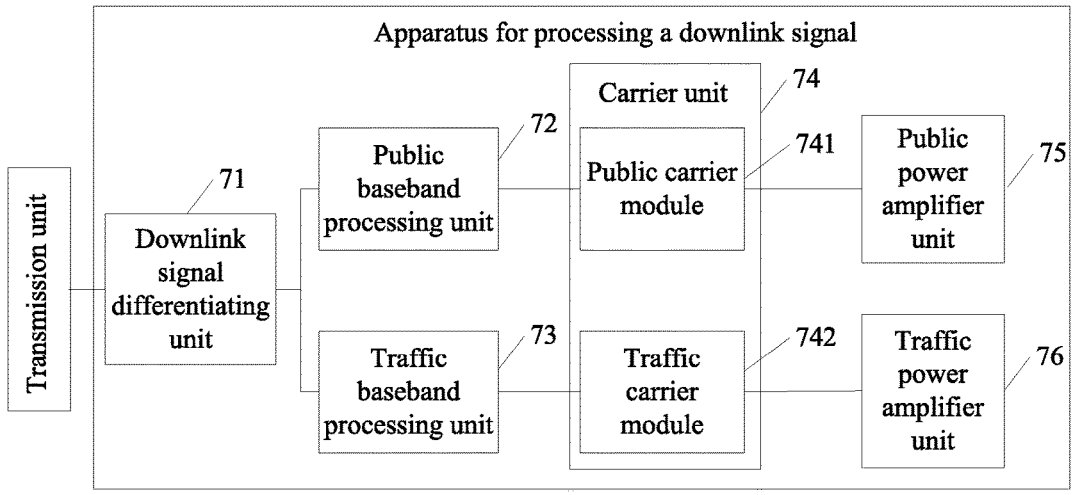
FIG. 8 is a schematic diagram illustrating components of an apparatus for processing a downlink signal according to Embodiment 3 of the present invention.

To save baseband processing resources, carrier processing resources and power amplification resources, this embodiment of the present invention provides an apparatus for processing a downlink signal which can be applied to a downlink of a base station. As shown in FIG. 8, the apparatus for processing a downlink signal may include a downlink signal differentiating unit 71, a public baseband processing unit 72, and a traffic baseband processing unit 73.

The downlink signal differentiating unit 71 is connected to a transmission unit, and is configured to receive a downlink signal transmitted by the transmission unit and differentiate a type of the downlink signal, where the downlink signal may be classified into a public downlink signal and a traffic downlink signal.

The public baseband processing unit 72 is connected to the downlink signal differentiating unit 71, and is configured to receive a public downlink signal obtained by the downlink signal differentiating unit 71 by means of differentiation, encode and modulate the public downlink signal to obtain a public baseband signal, and transmit the public baseband signal to a carrier unit 74.

The traffic baseband processing unit 73 is connected to the downlink signal differentiating unit 71, and is configured to receive a traffic downlink signal obtained by the downlink signal differentiating unit 71 by means of differentiation, encode and modulate the traffic downlink signal to obtain a traffic baseband signal, and transmit the traffic baseband signal to the carrier unit 74.

In an implementation scenario provided by this embodiment of the present invention, to further reduce power consumption of a carrier unit, a carrier processing unit of a public baseband signal is separate from a carrier processing unit of a traffic baseband signal, so that a power supply of the traffic carrier unit is turned off in a case where there is no traffic signal or there is low traffic volume. The carrier unit 74 may include a public carrier module 741 and a traffic carrier module 742. The apparatus for processing a downlink signal may further include a public power amplifier unit 75 and a traffic power amplifier unit 76.

The public carrier module 741 is connected to the public baseband processing unit 72, and is configured to receive a public baseband signal obtained by the public baseband processing unit 72 by means of processing, perform up-conversion and digital-to-analog DA conversion on the public baseband signal to obtain a public carrier signal, and transmit the public carrier signal to the public power amplifier unit 75.

In this embodiment, because the type of the downlink signal has already been differentiated by the downlink signal differentiating unit 71 before the baseband processing, the public downlink signal occupies a dedicated public downlink, that is, the public baseband processing unit 72, the public carrier module 741, and the public power amplifier unit 75; and the traffic downlink signal occupies a dedicated traffic downlink, that is, the traffic baseband processing unit 73, the traffic carrier module 742, and the traffic power amplifier unit 76. Therefore, the public carrier module 741 can receive a public baseband signal from the public baseband processing unit 72, and the traffic carrier module 742 can receive a traffic baseband signal from the traffic baseband processing unit 73, so that the types of the baseband signals may not be further differentiated. Similarly, the public power amplifier 75 can receive a public carrier signal from the public carrier module 741, and the traffic power amplifier unit 76 can receive a traffic carrier signal from the traffic carrier module 742, so that the types of the carrier signals may not be further differentiated.

In this embodiment, after receiving the public downlink signal transmitted by the public baseband processing unit 72, the public carrier module 741 performs a series of carrier processing operations, such as up-conversion and DA conversion, on the public downlink signal. The specific carrier processing operations may be the same as the carrier processing operations used by the carrier module in the prior art, which are not further described herein by this embodiment of the present invention.

The traffic carrier module 742 is connected to the traffic baseband processing unit 73, and is configured to receive a traffic baseband signal obtained by the traffic baseband processing unit 73 by means of processing, perform up-conversion and digital-to-analog DA conversion on the traffic baseband signal to obtain a traffic carrier signal, and transmit the traffic carrier signal to the traffic power amplifier unit 76.

In this embodiment, after receiving the traffic downlink signal transmitted by the traffic baseband processing unit 73, the traffic carrier module 742 performs a series of carrier processing operations, such as up-conversion and DA conversion, on the traffic downlink signal. The specific carrier processing operations may be the same as the carrier processing operations used by the carrier module in the prior art, which are not further described herein by this embodiment of the present invention.

The public power amplifier unit 75 is connected to the public carrier module 741, and is configured to receive the public carrier signal transmitted by the public carrier module 741, and output a public output signal after amplifying power of the public carrier signal.

The traffic power amplifier unit 76 is connected to the traffic carrier module 742, and is configured to receive the traffic carrier signal transmitted by the traffic carrier module 742, and output a traffic output signal after amplifying power of the traffic carrier signal.

Figure 9:
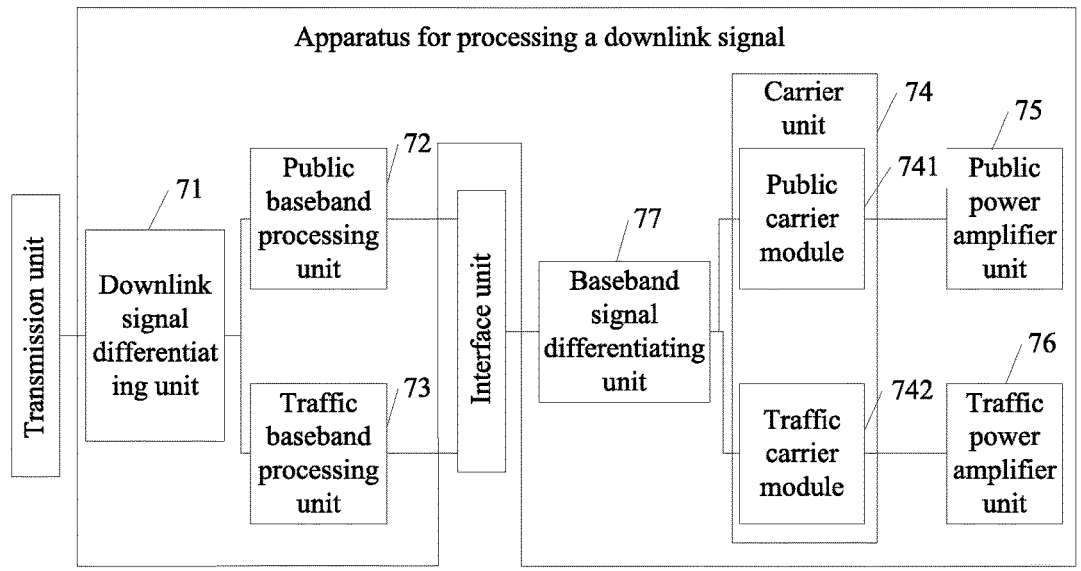
FIG. 9 is a schematic diagram illustrating components of another apparatus for processing a downlink signal according to Embodiment 3 of the present invention.

In addition, as shown in FIG. 9, in a distributed base station, an interface unit is further included, where the interface unit receives a public baseband signal and a traffic baseband signal transmitted by the public baseband processing unit 72 and the traffic baseband processing unit 73, and transmits the two baseband signals to a carrier processing apparatus for further carrier processing. To separate the public baseband signal and the traffic baseband signal transmitted by the interface unit, the apparatus for processing a downlink signal may further include a baseband signal differentiating unit 77.

The baseband signal differentiating unit 77 is connected to the public baseband processing unit 72 and the traffic baseband processing unit 73 by using the interface unit, and is configured to receive baseband signals transmitted by the public baseband processing unit 72 and the traffic baseband processing unit 73 through the interface unit, and differentiate types of the received baseband signals, where the baseband signals may be classified into a public baseband signal and a traffic baseband signal.

It should be noted that the baseband signal differentiating unit 77 may be a function unit added to the architecture of the base station independently, and may also be a subunit embedded into the interface unit, the public carrier module 741 or the traffic carrier unit 742.

The public carrier module 741 is connected to the baseband signal differentiating unit 77, and is further configured to receive a public baseband signal obtained by the baseband signal differentiating unit 77 by means of differentiation, perform up-conversion and digital-to-analog DA conversion on the public baseband signal to obtain a public carrier signal, and transmit the public carrier signal to the public power amplifier unit 75.

The traffic carrier module 742 is connected to the baseband signal differentiating unit 77, and is further configured to receive a traffic baseband signal obtained by the baseband signal differentiating unit 77 by means of differentiation, perform up-conversion and digital-to-analog DA conversion on the traffic baseband signal to obtain a traffic carrier signal, and transmit the traffic carrier signal to the traffic power amplifier unit 76.

This embodiment of the present invention also provides a method for processing a downlink signal which can be applied to an apparatus for processing a downlink signal, where the apparatus for processing a downlink signal includes a downlink signal differentiating unit, a public baseband processing unit, and a traffic baseband processing unit, where the downlink signal differentiating unit is connected to a transmission unit, the public baseband processing unit is connected to the downlink signal differentiating unit, and the traffic baseband processing unit is connected to the downlink signal differentiating unit.

Figure 10:
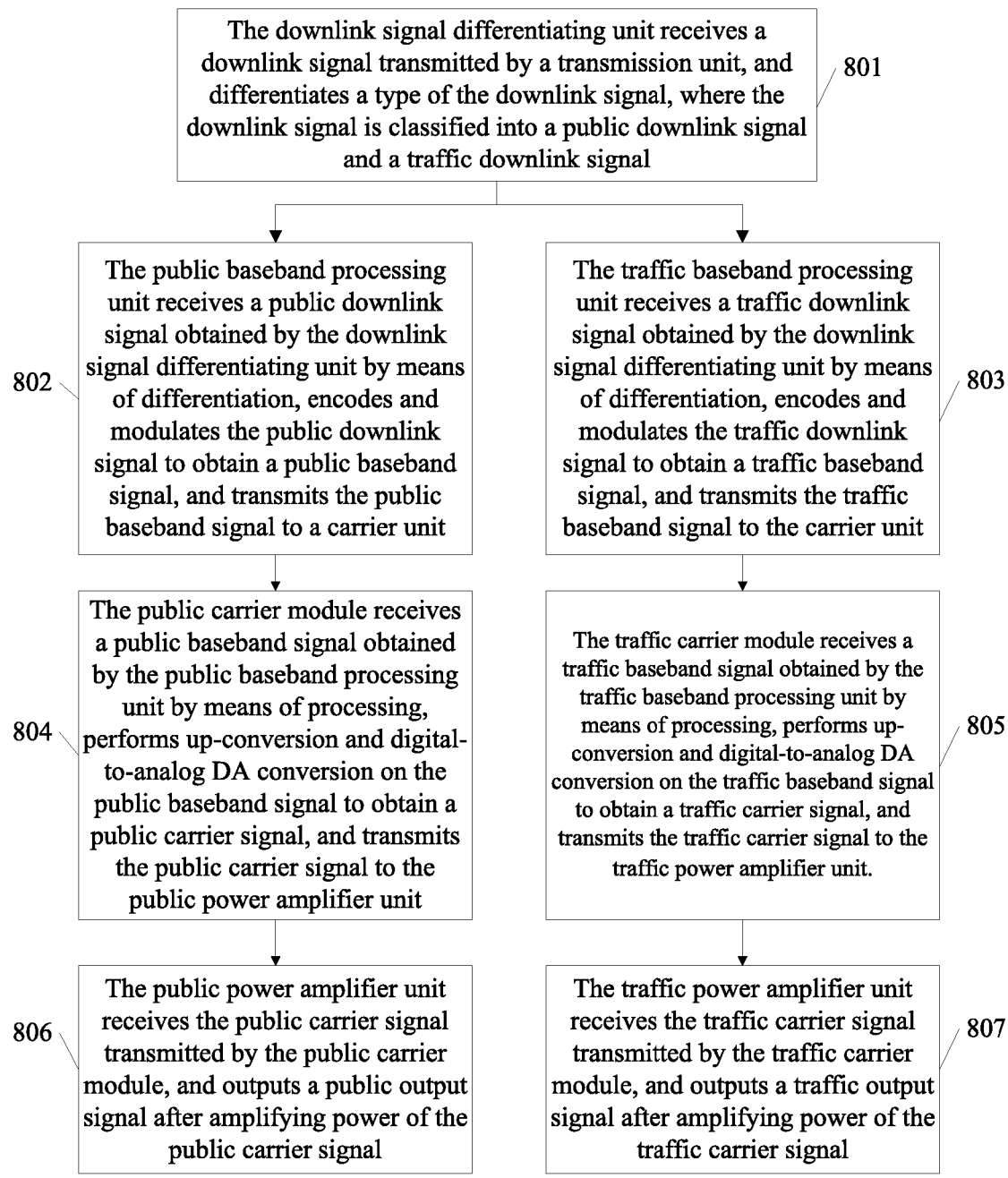
FIG. 10 is a flowchart of a method for processing a downlink signal according to Embodiment 3 of the present invention.

As shown in FIG. 10, the method may include the following.

801. The downlink signal differentiating unit receives a downlink signal transmitted by the transmission unit, and differentiates a type of the downlink signal, where the downlink signal is classified into a public downlink signal and a traffic downlink signal.

802. The public baseband processing unit receives a public downlink signal obtained by the downlink signal differentiating unit by means of differentiation, encodes and modulates the public downlink signal to obtain a public baseband signal, and transmits the public baseband signal to a carrier unit.

803. The traffic baseband processing unit receives a traffic downlink signal obtained by the downlink signal differentiating unit by means of differentiation, encodes and modulates the traffic downlink signal to obtain a traffic baseband signal, and transmits the traffic baseband signal to the carrier unit.

In an implementation scenario provided by this embodiment of the present invention, the carrier unit further includes a public carrier module and a traffic carrier module, where the public carrier module is connected to the public baseband processing unit, and the traffic carrier module is connected to the traffic baseband processing unit. The apparatus for processing a downlink signal may further include a public power amplifier unit and a traffic power amplifier unit, where the public power amplifier unit is connected to the public carrier module and the traffic power amplifier unit is connected to the traffic carrier module. The method may further include:

804. The public carrier module receives a public baseband signal obtained by the public baseband processing unit by means of processing, performs up-conversion and digital-to-analog DA conversion on the public baseband signal to obtain a public carrier signal, and transmits the public carrier signal to the public power amplifier unit;

805. The traffic carrier module receives a traffic baseband signal obtained by the traffic baseband processing unit by means of processing, performs up-conversion and digital-to-analog DA conversion on the traffic baseband signal to obtain a traffic carrier signal, and transmits the traffic carrier signal to the traffic power amplifier unit.

806. The public power amplifier unit receives the public carrier signal transmitted by the public carrier module, and outputs a public output signal after amplifying power of the public carrier signal.

807. The traffic power amplifier unit receives the traffic carrier signal transmitted by the traffic carrier module, and outputs a traffic output signal after amplifying power of the traffic carrier signal.

In addition, in a distributed base station, the apparatus for processing a downlink signal may further include a baseband signal differentiating unit, where the baseband signal differentiating unit is connected to the public baseband processing unit and the traffic baseband processing unit by using the interface unit.

Figure 11:
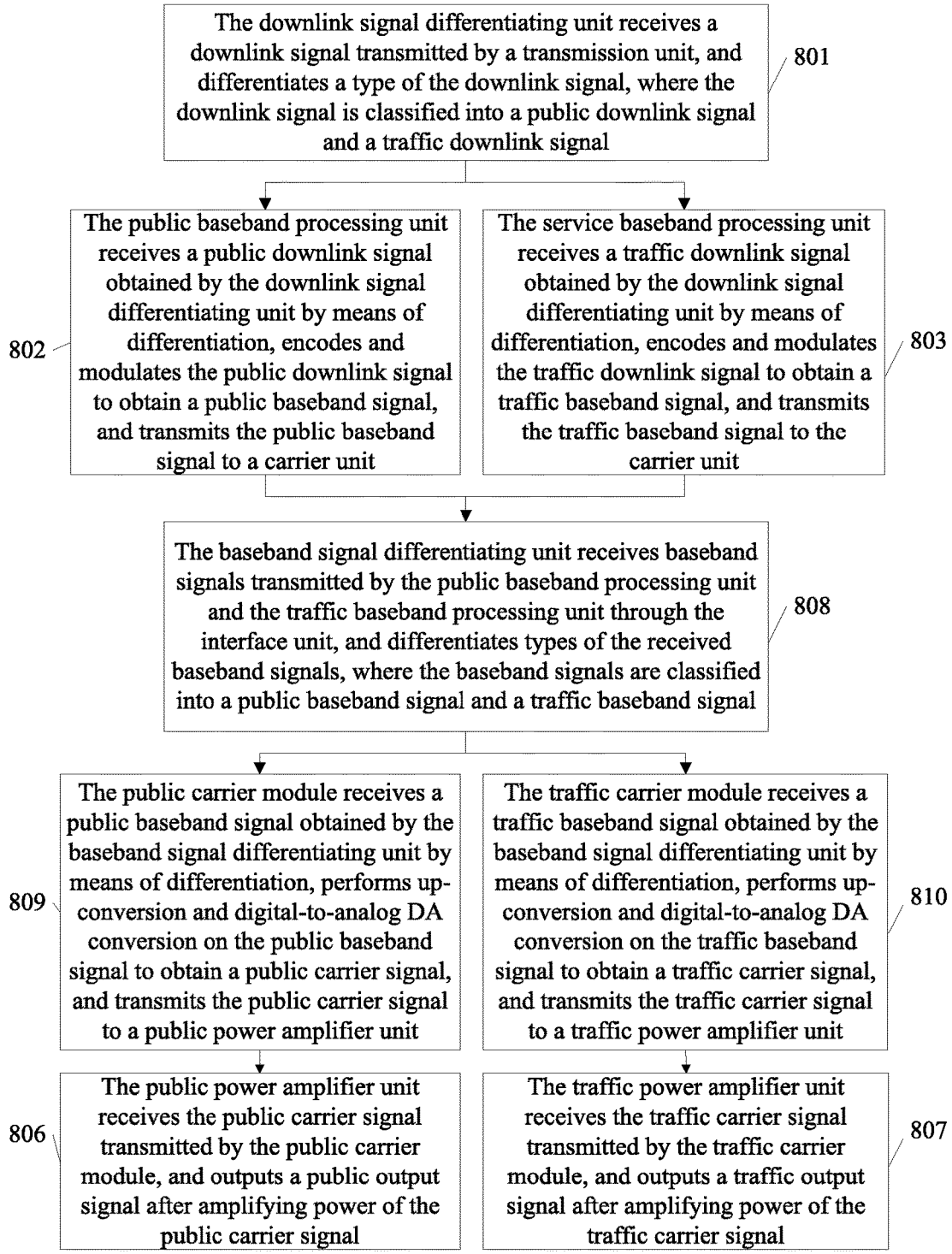
FIG. 11 is a flowchart of another method for processing a downlink signal according to Embodiment 3 of the present invention.

As shown in FIG. 11, the method may further include the following.

808. The baseband signal differentiating unit receives baseband signals transmitted by the public baseband processing unit and the traffic baseband processing unit through the interface unit, and differentiates types of the received baseband signals, where the baseband signals are classified into a public baseband signal and a traffic baseband signal.

809. The public carrier module receives a public baseband signal obtained by the baseband signal differentiating unit by means of differentiation, performs up-conversion and digital-to-analog DA conversion on the public baseband signal to obtain a public carrier signal, and transmits the public carrier signal to the public power amplifier unit.

810. The traffic carrier module receives a traffic baseband signal obtained by the baseband signal differentiating unit by means of differentiation, performs up-conversion and digital-to-analog DA conversion on the traffic baseband signal to obtain a traffic carrier signal, and transmits the traffic carrier signal to the traffic power amplifier unit.

Because the apparatus for processing a downlink signal provided by this embodiment of the present invention can be used applied to the base station and as a part of the downlink device, to make a person skilled in the art understand a scenario where this embodiment of the present invention is applied to the base station, the following describes a scenario where the apparatus for processing a downlink signal is applied to the base station.

Figure 12:
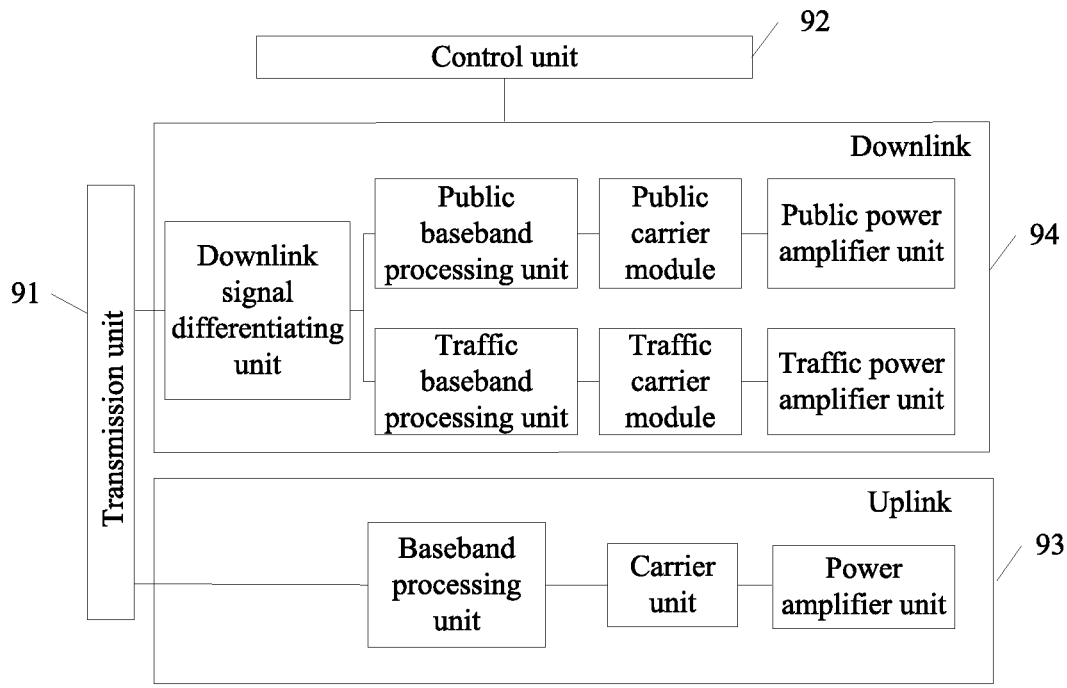
FIG. 12 is a schematic diagram illustrating components of a base station according to Embodiment 3 of the present invention.

This embodiment of the present invention also provides a base station. As shown in FIG. 12, the base station may include a transmission unit 91, a control unit 92, an uplink device 93, and a downlink device 94 that includes the apparatus for processing a downlink signal in this embodiment of the present invention.

The transmission unit 91, the control unit 92, the uplink device 93, and the downlink device 94 are inherent components of the base station. In an application scenario of this embodiment of the present invention, only a partial modification is made to the downlink device 94. However, the public baseband processing unit, the traffic baseband processing unit, the carrier unit, the traffic power amplifier unit, and the public power amplifier unit provided in this embodiment of the present invention are internal function modules of the apparatus for processing a downlink signal and form the apparatus for processing a downlink signal. The apparatus for processing a downlink signal is an internal apparatus of the downlink device 94.

The transmission unit 91 is connected to the uplink device 93 and the downlink device 94, and may be configured to receive an uplink signal transmitted by the uplink device 93 and may be further configured to transmit a downlink signal to the downlink device 94.

The control unit 92 is connected to the downlink device 94, and is configured to control enabling and disabling of some function units and modules in the downlink device 94.

In addition, function units and modules controlled by the control unit 92 may include a traffic baseband processing unit, a traffic power amplifier unit, and a traffic carrier module. The control unit 92 monitors the transmission unit 91, disables the traffic baseband processing unit, the traffic power amplifier unit and the traffic carrier module when the transmission unit 91 does not transmit a traffic downlink signal to the downlink device 94, and enables the traffic baseband processing unit, the traffic power amplifier unit, or the traffic carrier module when the transmission unit 91 transmits a traffic downlink signal to the downlink device 94.

Specifically, the control unit 92 may disable the traffic baseband processing unit when there is no downlink traffic or there is low downlink traffic volume, and may also re-enable the traffic baseband processing unit when the transmission unit 91 transmits a downlink signal to the downlink device 94. For example, the control unit 92 may shut down power supplies of the traffic baseband processing unit, the traffic carrier module, and the traffic power amplifier unit when there is no downlink traffic, and may also reduce voltage and power of the traffic baseband processing unit, the traffic carrier module, and the traffic power amplifier unit when there is low traffic volume.

It should be noted that for details about specific descriptions of the part of the method and the base station for processing a downlink signal in this embodiment of the present invention, reference may be made to Embodiment 1, Embodiment 2, and the corresponding content in the apparatus for processing a downlink signal in this embodiment of the present invention, which are not further described herein by this embodiment of the present invention.

The apparatus and method for processing a downlink signal provided by this embodiment of the present invention, by separating a transmission link of a traffic signal from a transmission link of a public signal, enables a current energy conservation technology to disconnect or hibernate the transmission link of the traffic signal when there is no traffic signal. Compared with an architecture in the prior art where the transmission link of the traffic signal cannot be disconnected or hibernated due to long-term use of the transmission link by the public signal, this embodiment of the present invention can reduce energy consumption of a base station more effectively.

Embodiment 4

Figure 13:
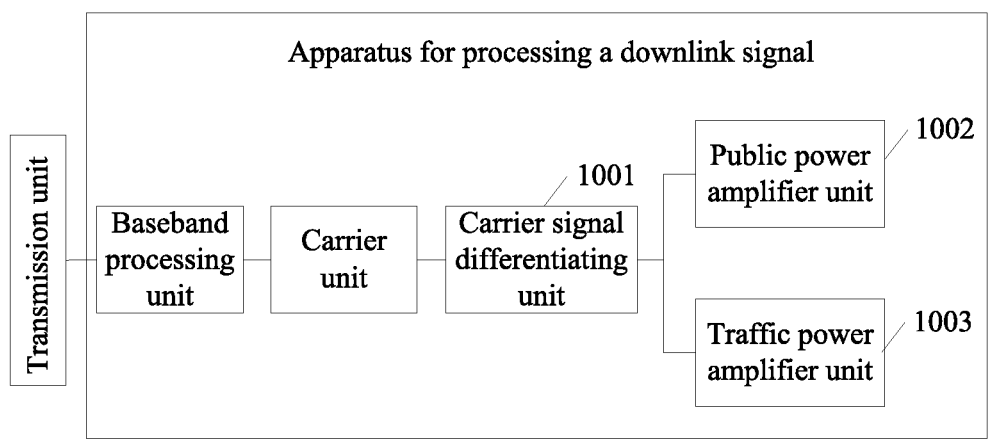
FIG. 13 is a schematic diagram illustrating components of an apparatus for processing a downlink signal according to Embodiment 4 of the present invention.

This embodiment of the present invention provides an apparatus for processing a downlink signal which can be applied to a downlink of a base station. As shown in FIG. 13, the apparatus for processing a downlink signal may include a carrier signal differentiating unit 1001, a public power amplifier 1002, and a traffic power amplifier 1003.

The carrier signal differentiating unit 1001 is connected to a carrier unit of the downlink of the base station, and is configured to receive a carrier signal obtained by the carrier unit by means of processing, and differentiate a type of the carrier signal, where the carrier signal is classified into a public carrier signal and a traffic carrier signal.

The public power amplifier unit 1002 is connected to the carrier signal differentiating unit 1001, and is configured to receive a public carrier signal obtained by the carrier signal differentiating unit 1001 by means of differentiation, and output a public output signal after amplifying power of the public carrier signal.

The traffic power amplifier unit 1003 is connected to the carrier signal differentiating unit 1001, and is configured to receive a traffic carrier signal obtained by the carrier signal differentiating unit 1001 by means of differentiation, and output a traffic output signal after amplifying power of the traffic carrier signal.

By using the apparatus for processing a downlink signal illustrated in FIG. 13, power amplification processing of the traffic carrier signal is separate from power amplification processing of the public carrier signal, so that the traffic power amplifier unit can be disabled when there is no downlink traffic or there is low downlink traffic volume, thereby saving energy resources of the base station. In addition, the baseband processing unit and the carrier unit are not adjusted, and the base station can maintain the original baseband processing unit and the carrier unit, and therefore the construction cost is low.

Figure 14:
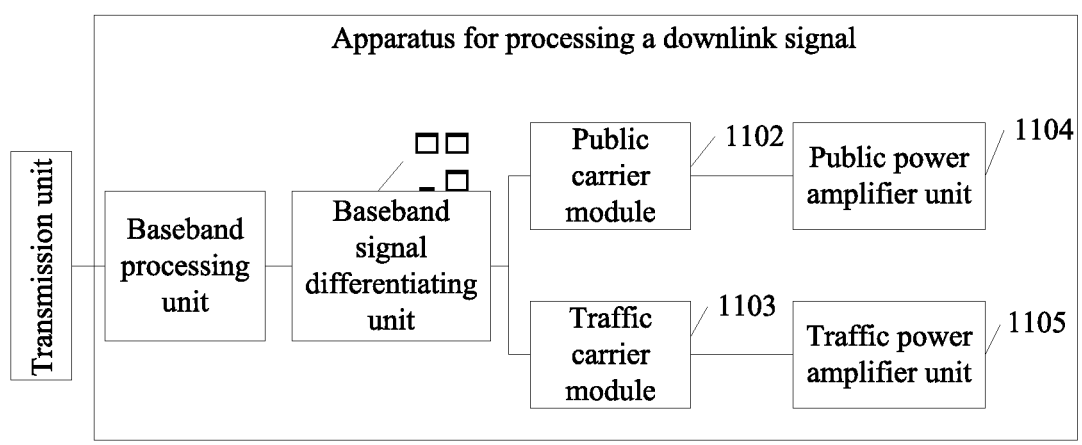
FIG. 14 is a schematic diagram illustrating components of another apparatus for processing a downlink signal according to Embodiment 4 of the present invention.

To further save carrier processing resources, this embodiment of the present invention further provides an apparatus for processing a downlink signal. As shown in FIG. 14, the apparatus for processing downlink signals may include a baseband signal differentiating unit 1101, a public carrier module 1102, a traffic carrier module 1103, a public power amplifier unit 1104, and a traffic power amplifier unit 1105.

The baseband signal differentiating unit 1101 is connected to a baseband processing unit of the downlink of the base station, and is configured to receive a baseband signal transmitted by the baseband processing unit, and differentiate a type of the received baseband signal, where the baseband signal may be classified into a public baseband signal and a traffic baseband signal.

The public carrier unit 1102 is connected to the baseband signal differentiating unit 1101, and is further configured to receive a public baseband signal obtained by the baseband signal differentiating unit 1101 by means of differentiation, perform up-conversion and digital-to-analog DA conversion on the public baseband signal to obtain a public carrier signal, and transmit the public carrier signal to the public power amplifier unit 1104.

The traffic carrier module 1103 is connected to the baseband signal differentiating unit 1101, and is further configured to receive a traffic baseband signal obtained by the baseband signal differentiating unit 1101 by means of differentiation, perform up-conversion and digital-to-analog DA conversion on the traffic baseband signal to obtain a traffic carrier signal, and transmit the traffic carrier signal to the traffic power amplifier unit 1105.

The public power amplifier unit 1104 is connected to the public carrier module 1102, and is configured to receive the public carrier signal transmitted by the public carrier module 1102, and output a public output signal after amplifying power of the public carrier signal.

The traffic power amplifier unit 1105 is connected to the traffic carrier module 1103, and is configured to receive the traffic carrier signal transmitted by the traffic carrier module 1103, and output a traffic output signal after amplifying power of the traffic carrier signal.

The apparatus for processing a downlink signal provided by this embodiment of the present invention, by separating a transmission link of a traffic signal from a transmission link of a public signal, enables a current energy conservation technology to disconnect or hibernate the transmission link of the traffic signal when there is no traffic signal. Compared with an architecture in the prior art where the transmission link of the traffic signal cannot be disconnected or hibernated due to long-term use of the transmission link by the public signal, this embodiment of the present invention can reduce energy consumption of a base station more effectively.

Based on the foregoing descriptions of the embodiments, it may be clearly understood by a person skilled in the art that, the present invention may be implemented by software in addition to necessary universal hardware and certainly may also be implemented by hardware. However, in many cases, the former implementation manner is preferred. Based on such an understanding, the technical solutions of the present invention essentially or the part contributing to the prior art may be implemented in the form of a software product. The computer software product is stored in a readable storage medium, for example, a floppy disk, a hard disk, or an optical disc of a computer, and includes several instructions for instructing a computer device (which may be a personal computer, a server, a network device, or the like) to perform the methods described in the embodiments of the present invention.

The foregoing descriptions are merely specific embodiments of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. An apparatus for processing a downlink signal, applied to a downlink of a base station, the apparatus comprising:
   a computer including a non-transitory computer-readable medium storing program units executable by the computer, the units including:
      a baseband signal differentiating unit;
      a public carrier module; and
      a traffic carrier module;
   a public power amplifier unit; and
   a traffic power amplifier unit;
   wherein the baseband signal differentiating unit is configured to be connected to a baseband processing unit of the downlink of the base station, to receive a baseband signal transmitted by baseband processing unit, and to differentiate a type of the received baseband signal, wherein the baseband signal is classified into a public baseband signal and a traffic baseband signal;
   wherein the baseband signal differentiating unit differentiates the type of the baseband signal by determining the type of the baseband signal and wherein the baseband signal differentiating units sends, according to the determined type of the baseband signal, the received baseband signal to only one of the public carrier module or the traffic carrier module;
   wherein the public carrier module is connected to the baseband signal differentiating unit and is configured to receive a public baseband signal obtained by the baseband signal differentiating unit by the differentiating, to perform up-conversion and digital-to-analog conversion on the public baseband signal to obtain a public carrier signal, and to transmit the public carrier signal to the public power amplifier unit;
   wherein the traffic carrier module is connected to the baseband signal differentiating unit and is configured to receive a traffic baseband signal obtained by the baseband signal differentiating unit by the differentiating, to perform up-conversion and digital-to-analog conversion on the traffic baseband signal to obtain a traffic carrier signal, and to transmit the traffic carrier signal to the traffic power amplifier unit;
   wherein the public power amplifier unit is connected to the public carrier module and is configured to receive the public carrier signal transmitted by the public carrier module and to output a public output signal after amplifying power of the public carrier signal; and
   wherein the traffic power amplifier unit is connected to the traffic carrier module and is configured to receive the traffic carrier signal transmitted by the traffic carrier module and to output a traffic output signal after amplifying power of the traffic carrier signal.

2. An apparatus for processing a downlink signal, applied to a downlink of a base station, the apparatus comprising:
   a computer including a non-transitory computer-readable medium storing program units executable by the computer, the units including a carrier signal differentiating unit;
   a public power amplifier unit; and
   a traffic power amplifier unit;
   wherein the carrier signal differentiating unit is configured to be connected to a carrier unit of the downlink of the base station, to receive a carrier signal obtained by the carrier unit by the differentiating, and to differentiate a type of the carrier signal, wherein the carrier signal is classified into a public carrier signal and a traffic carrier signal;
   wherein the public power amplifier unit is connected to the carrier signal differentiating unit and is configured to receive a public carrier signal obtained by the carrier signal differentiating unit by the differentiating, and to output a public output signal after amplifying power of the public carrier signal;
   wherein the traffic power amplifier unit is connected to the carrier signal differentiating unit and is configured to receive a traffic carrier signal obtained by the carrier signal differentiating unit by the differentiating, and to output a traffic output signal after amplifying power of the traffic carrier signal; and
   wherein the carrier signal differentiating unit differentiates the type of the carrier signal by determining the type of the carrier signal and wherein the carrier signal differentiating units sends, according to the determined type of the carrier signal, the received carrier signal to only one of the public power amplifier unit or the traffic power amplifier unit.

3. An apparatus for processing a downlink signal, applied to a downlink of a base station, the apparatus comprising:
   a computer including a non-transitory computer-readable medium storing program units executable by the computer, the units including:
      a downlink signal differentiating unit;
      a public baseband processing unit; and
      a traffic baseband processing unit;
   wherein the downlink signal differentiating unit is configured to be connected to a transmission unit in the base station, to receive a downlink signal transmitted by the transmission unit and to differentiate a type of the downlink signal, wherein the downlink signal is classified into a public downlink signal and a traffic downlink signal;
   wherein the public baseband processing unit is connected to the downlink signal differentiating unit and is configured to receive a public downlink signal obtained by the downlink signal differentiating unit by the differentiating, to encode and modulate the public downlink signal to obtain a public baseband signal, and to transmit the public baseband signal to a carrier unit; and
   wherein the traffic baseband processing unit is connected to the downlink signal differentiating unit and is configured to receive a traffic downlink signal obtained by the downlink signal differentiating unit by the differentiating, to encode and modulate the traffic downlink signal to obtain a traffic baseband signal, and to transmit the traffic baseband signal to the carrier unit.

4. The apparatus according to claim 3, the units further including a carrier signal differentiating unit;

wherein the apparatus further comprises:
a public power amplifier unit; and
a traffic power amplifier unit;
wherein the carrier signal differentiating unit is configured to be connected to the carrier unit, to receive a carrier signal obtained by processing in the carrier unit, and to differentiate a type of the carrier signal, wherein the carrier signal is classified into a public carrier signal and a traffic carrier signal;
wherein the public power amplifier unit is connected to the carrier signal differentiating unit and is configured to receive a public carrier signal obtained by the carrier signal differentiating unit by the differentiating and to output a public output signal after amplifying power of the public carrier signal; and
wherein the traffic power amplifier unit is connected to the carrier signal differentiating unit and is configured to receive a traffic carrier signal obtained by the carrier signal differentiating unit by the differentiating and to output a traffic output signal after amplifying power of the traffic carrier signal.

5. The apparatus according to claim 4, wherein the carrier unit comprises a public carrier module and a traffic carrier module;
wherein the apparatus for processing a downlink signal further comprises a public power amplifier unit and a traffic power amplifier unit;
wherein the public carrier module is connected to the public baseband processing unit and is configured to receive a public baseband signal obtained by the public baseband processing unit by processing, to perform up-conversion and digital-to-analog conversion on the public baseband signal to obtain a public carrier signal, and to transmit the public carrier signal to the public power amplifier unit;
wherein the traffic carrier module is connected to the traffic baseband processing unit and is configured to receive a traffic baseband signal obtained by the traffic baseband processing unit by processing, perform up-conversion and digital-to-analog conversion on the traffic baseband signal to obtain a traffic carrier signal, and to transmit the traffic carrier signal to the traffic power amplifier unit;
wherein the public power amplifier unit is connected to the public carrier module and is configured to receive the public carrier signal transmitted by the public carrier module and to output a public output signal after amplifying power of the public carrier signal; and
wherein the traffic power amplifier unit is connected to the traffic carrier module and is configured to receive the traffic carrier signal transmitted by the traffic carrier module and to output a traffic output signal after amplifying power of the traffic carrier signal.

6. The apparatus according to claim 5, wherein the based station is configured as a distributed base station;
wherein the units further include a baseband signal differentiating unit;
wherein the baseband signal differentiating unit is connected to the public baseband processing unit and the traffic baseband processing unit by using an interface unit, and is configured to receive baseband signals transmitted by the public baseband processing unit and the traffic baseband processing unit through the interface unit, and to differentiate types of the received baseband signals, wherein the baseband signals are classified into a public baseband signal and a traffic baseband signal;
wherein the public carrier module is connected to the baseband signal differentiating unit and is further configured to receive a public baseband signal obtained by the baseband signal differentiating unit by the differentiating, to perform up-conversion and digital-to-analog conversion on the public baseband signal to obtain a public carrier signal, and to transmit the public carrier signal to the public power amplifier unit; and
wherein the traffic carrier module is connected to the baseband signal differentiating unit and is further configured to receive a traffic baseband signal obtained by the baseband signal differentiating unit by the differentiating, to perform up-conversion and digital-to-analog conversion on the traffic baseband signal to obtain a traffic carrier signal, and to transmit the traffic carrier signal to the traffic power amplifier unit.

7. The apparatus according to claim 4, wherein the based station is configured as a distributed base station;
wherein the units further include a baseband signal differentiating unit, a public carrier module, and a traffic carrier module;
wherein the baseband signal differentiating unit is connected to the public baseband processing unit and the traffic baseband processing unit by using an interface unit, and is configured to receive baseband signals transmitted by the public baseband processing unit and the traffic baseband processing unit through the interface unit, and to differentiate types of the received baseband signals, wherein the baseband signals are classified into a public baseband signal and a traffic baseband signal;
wherein the public carrier module is connected to the baseband signal differentiating unit and is further configured to receive a public baseband signal obtained by the baseband signal differentiating unit by the differentiating, to perform up-conversion and digital-to-analog conversion on the public baseband signal to obtain a public carrier signal, and to transmit the public carrier signal to the public power amplifier unit; and
wherein the traffic carrier module is connected to the baseband signal differentiating unit and is further configured to receive a traffic baseband signal obtained by the baseband signal differentiating unit by the differentiating, to perform up-conversion and digital-to-analog conversion on the traffic baseband signal to obtain a traffic carrier signal, and to transmit the traffic carrier signal to the traffic power amplifier unit.

8. The apparatus according to claim 3, wherein the carrier unit comprises a public carrier module and a traffic carrier module;
wherein the apparatus for processing a downlink signal further comprises a public power amplifier unit and a traffic power amplifier unit;
wherein the public carrier module is connected to the public baseband processing unit and is configured to receive a public baseband signal obtained by the public baseband processing unit by processing, to perform up-conversion and digital-to-analog conversion on the public baseband signal to obtain a public carrier signal, and to transmit the public carrier signal to the public power amplifier unit;
wherein the traffic carrier module is connected to the traffic baseband processing unit and is configured to receive a traffic baseband signal obtained by the traffic baseband processing unit by processing, perform up-conversion and digital-to-analog conversion on the traffic baseband signal to obtain a traffic carrier signal, and to transmit the traffic carrier signal to the traffic power amplifier unit;

wherein the public power amplifier unit is connected to the public carrier module and is configured to receive the public carrier signal transmitted by the public carrier module and to output a public output signal after amplifying power of the public carrier signal; and wherein the traffic power amplifier unit is connected to the traffic carrier module and is configured to receive the traffic carrier signal transmitted by the traffic carrier module and to output a traffic output signal after amplifying power of the traffic carrier signal.

9. The apparatus according to claim 8, wherein the based station is configured as a distributed base station;

wherein the units further include a baseband signal differentiating unit;

wherein the baseband signal differentiating unit is connected to the public baseband processing unit and the traffic baseband processing unit by using an interface unit, and is configured to receive baseband signals transmitted by the public baseband processing unit and the traffic baseband processing unit through the interface unit, and to differentiate types of the received baseband signals, wherein the baseband signals are classified into a public baseband signal and a traffic baseband signal;

wherein the public carrier module is connected to the baseband signal differentiating unit and is further configured to receive a public baseband signal obtained by the baseband signal differentiating unit by the differentiating, to perform up-conversion and digital-to-analog conversion on the public baseband signal to obtain a public carrier signal, and to transmit the public carrier signal to the public power amplifier unit; and wherein the traffic carrier module is connected to the baseband signal differentiating unit and is further configured to receive a traffic baseband signal obtained by the baseband signal differentiating unit by the differentiating, to perform up-conversion and digital-to-analog conversion on the traffic baseband signal to obtain a traffic carrier signal, and to transmit the traffic carrier signal to the traffic power amplifier unit.

10. The apparatus according to claim 3, wherein the based station is configured as a distributed base station;

wherein the apparatus further comprises a baseband signal differentiating unit, a public carrier module and a traffic carrier module;

wherein the baseband signal differentiating unit is connected to the public baseband processing unit and the traffic baseband processing unit by using an interface unit, and is configured to receive baseband signals transmitted by the public baseband processing unit and the traffic baseband processing unit through the interface unit, and to differentiate types of the received baseband signals, wherein the baseband signals are classified into a public baseband signal and a traffic baseband signal;

wherein the public carrier module is connected to the baseband signal differentiating unit and is further configured to receive a public baseband signal obtained by the baseband signal differentiating unit by the differentiating, to perform up-conversion and digital-to-analog conversion on the public baseband signal to obtain a public carrier signal, and to transmit the public carrier signal to a public power amplifier unit; and wherein the traffic carrier module is connected to the baseband signal differentiating unit and is further configured to receive a traffic baseband signal obtained by the baseband signal differentiating unit by the differentiating, to perform up-conversion and digital-to-analog conversion on the traffic baseband signal to obtain a traffic carrier signal, and to transmit the traffic carrier signal to a traffic power amplifier unit.

11. A method for processing a downlink signal, the method comprising:

receiving a downlink signal transmitted by a base station;

differentiating a type of the downlink signal, wherein the downlink signal is classified into a public downlink signal and a traffic downlink signal;

receiving a public downlink signal obtained by the differentiating;

encoding and modulating the public downlink signal to obtain a public baseband signal;

transmitting the public baseband signal to a carrier unit;

receiving a traffic downlink signal obtained by the differentiating;

encoding and modulating the traffic downlink signal to obtain a traffic baseband signal; and transmitting the traffic baseband signal to the carrier unit.

12. The method according to claim 11, further comprising:

receiving a carrier signal obtained by the carrier unit;

differentiating a type of the carrier signal, wherein the carrier signal is classified into a public carrier signal and a traffic carrier signal;

receiving a public carrier signal obtained by the differentiating;

outputting a public output signal based on the public carrier signal;

receiving a traffic carrier signal obtained by the differentiating; and outputting a traffic output signal based on the traffic carrier signal.

13. The method according to claim 12, further comprising:

amplifying the public output signal before outputting the public output signal; and amplifying the traffic output signal before outputting the traffic output signal.

14. The method according to claim 11, further comprising:

receiving a public baseband signal;

performing up-conversion and digital-to-analog conversion on the public baseband signal to obtain a public carrier signal;

receiving a traffic baseband signal;

performing up-conversion and digital-to-analog conversion on the traffic baseband signal to obtain a traffic carrier signal;

amplifying power of the public carrier signal;

outputting a public output signal after amplifying the power of the public carrier signal;

amplifying power of the traffic carrier signal; and outputting a traffic output signal after amplifying the power of the traffic carrier signal.

15. The method according to claim 11, further comprising:

receiving baseband signals;

differentiating types of the received baseband signal, wherein the baseband signals are classified into a public baseband signal and a traffic baseband signal;

receiving a public baseband signal obtained by the differentiating;

performing up-conversion and digital-to-analog conversion on the public baseband signal to obtain a public carrier signal;

receiving a traffic baseband signal obtained by the differentiating; and performing up-conversion and digital-to-analog conversion on the traffic baseband signal to obtain a traffic carrier signal.

16. The method according to claim 15, further comprising:

amplifying the public carrier signal; and amplifying the traffic carrier signal.

17. The method according to claim 11, wherein method is performed by an apparatus that comprises a computer including a non-transitory computer-readable medium storing program units executable by the computer, the units including a downlink signal differentiating unit, a public baseband processing unit, and a traffic baseband processing unit;

wherein the downlink signal differentiating unit is connected to a transmission unit, the public baseband processing unit is connected to the downlink signal differentiating unit, and the traffic baseband processing unit is connected to the downlink signal differentiating unit;

wherein the downlink signal differentiating unit performs the steps of receiving the downlink signal and differentiating the type of the downlink signal;

wherein the public baseband processing unit performs the steps of receiving the public downlink signal, encoding and modulating the public downlink signal, and transmitting the public baseband signal to the carrier unit; and wherein the traffic baseband processing unit performs the steps of receiving the traffic downlink signal, encoding and modulating the traffic downlink signal, and transmitting the traffic baseband signal to the carrier unit.

18. The method for processing a downlink signal according to claim 17, wherein the units further include a carrier signal differentiating unit, a public power amplifier unit, and a traffic power amplifier unit, the carrier signal differentiating unit being connected to the carrier unit, the public power amplifier unit being connected to the carrier signal differentiating unit, and the traffic power amplifier unit being connected to the carrier signal differentiating unit, the method further comprising:

receiving, by the carrier signal differentiating unit, a carrier signal obtained by the carrier unit by processing;

differentiating, by the carrier signal differentiating unit, a type of the carrier signal, wherein the carrier signal is classified into a public carrier signal and a traffic carrier signal;

receiving, by the public power amplifier unit, a public carrier signal obtained by the carrier signal differentiating unit by the differentiating;

outputting, by the public power amplifier unit, a public output signal after amplifying power of the public carrier signal;

receiving, by the traffic power amplifier unit, a traffic carrier signal obtained by the carrier signal differentiating unit by the differentiating; and outputting, by the traffic power amplifier unit, a traffic output signal after amplifying power of the traffic carrier signal.

19. The method according to claim 17, wherein the carrier unit is one of the program units executable by the computer and further comprises a public carrier module and a traffic carrier module, wherein the public carrier module is connected to the public baseband processing unit, wherein the traffic carrier module is connected to the traffic baseband processing unit, wherein the apparatus further comprises a public power amplifier unit and a traffic power amplifier unit, wherein the public power amplifier unit is connected to the public carrier module, and wherein the traffic power amplifier unit is connected to the traffic carrier module, the method further comprising:

receiving, by the public carrier module, a public baseband signal obtained by the public baseband processing unit by processing;

performing, by the public carrier module, up-conversion and digital-to-analog conversion on the public baseband signal to obtain a public carrier signal;

transmitting, by the public carrier module, the public carrier signal to the public power amplifier unit;

receiving, by the traffic carrier module, a traffic baseband signal obtained by the traffic baseband processing unit by processing;

performing, by the traffic carrier module, up-conversion and digital-to-analog DA conversion on the traffic baseband signal to obtain a traffic carrier signal;

transmitting, by the traffic carrier module, the traffic carrier signal to the traffic power amplifier unit;

receiving, by the public power amplifier unit, the public carrier signal transmitted by the public carrier module;

outputting, by the public power amplifier unit, a public output signal after amplifying power of the public carrier signal;

receiving, by the traffic power amplifier unit, the traffic carrier signal transmitted by the traffic carrier module; and outputting, by the traffic power amplifier unit, a traffic output signal after amplifying power of the traffic carrier signal.

20. The method according to claim 17, wherein the base station is a distributed base station, wherein the units further include a baseband signal differentiating unit, a public carrier module, and a traffic carrier module, wherein the baseband signal differentiating unit is connected to the public baseband processing unit and the traffic baseband processing unit by using an interface unit; the method further comprising:

receiving, by the baseband signal differentiating unit, baseband signals transmitted by the public baseband processing unit and the traffic baseband processing unit through the interface unit; differentiating, by the baseband signal differentiating unit, types of the received baseband signal, wherein the baseband signals are classified into a public baseband signal and a traffic baseband signal;

receiving, by the public carrier module, a public baseband signal obtained by the baseband signal differentiating unit by the differentiating;

performing, by the public carrier module, up-conversion and digital-to-analog conversion on the public baseband signal to obtain a public carrier signal;

transmitting, by the public carrier module, the public carrier signal to a public power amplifier unit;

receiving, by the traffic carrier module, a traffic baseband signal obtained by the baseband signal differentiating unit by the differentiation;

performing, by the traffic carrier module, up-conversion and digital-to-analog conversion on the traffic baseband signal to obtain a traffic carrier signal; and transmitting, by the traffic carrier module, the traffic carrier signal to a traffic power amplifier unit.

\* \* \* \* \*